(12) United States Patent
Kajigaya

(10) Patent No.: US 7,830,738 B2
(45) Date of Patent: *Nov. 9, 2010

(54) SEMICONDUCTOR MEMORY DEVICE

(75) Inventor: Kazuhiko Kajigaya, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 153 days.

This patent is subject to a terminal disclaimer.

(21) Appl. No.: 12/116,264

(22) Filed: May 7, 2008

(65) Prior Publication Data

US 2008/0278991 A1    Nov. 13, 2008

(30) Foreign Application Priority Data

May 8, 2007    (JP)    ............... 2007-123996

(51) Int. Cl.
*G11C 7/00*    (2006.01)
(52) U.S. Cl. ........................... 365/207; 265/205
(58) Field of Classification Search ................. 365/207, 365/205, 189.04, 185.13
See application file for complete search history.

(56) References Cited

U.S. PATENT DOCUMENTS

| 4,419,743 | A | 12/1983 | Taguchi |
| 6,452,851 | B1 * | 9/2002 | Endo et al. .................. 365/205 |
| 6,646,954 | B2 * | 11/2003 | Winograd et al. ......... 365/233.14 |
| 6,937,535 | B2 * | 8/2005 | Ahn et al. .................... 365/222 |
| 7,200,061 | B2 * | 4/2007 | Sekiguchi et al. ........... 365/207 |
| 2002/0030214 | A1 | 3/2002 | Horiguchi |

FOREIGN PATENT DOCUMENTS

| JP | 58-32789 | 7/1983 |
| JP | 60-98597 | 6/1985 |
| JP | 2002-094027 | 3/2002 |

OTHER PUBLICATIONS

John Barth et al., "A 500MHz Random Cycle 1.5ns-Latency, SOI Embedded DRAM Macro Featuring a 3T Micro Sense Amplifier", IEEE International Solid-Stat Circuits Conference, ISSCC 2007/ Session 27/DRAM and eRAM/27.1, Feb. 14, 2007, Digest of Technical Papers, pp. 486-487, 617, 27.1.1-27.1.7.
Advance Program, ISSCC 2007 IEEE International Solid-State Circuits Conference, Feb. 11-15, 2007, Conference Theme: The 4 Dimensions of IC Innovation, San Francisco Marriott Hotel, pp. 2-3, 80-81.

* cited by examiner

*Primary Examiner*—Anh Phung
(74) *Attorney, Agent, or Firm*—Young & Thompson

(57) ABSTRACT

A semiconductor memory device comprises. word lines; global bit lines intersecting with the word lines; local bit lines partitioned into N (N is an integer greater than or equal to two) sections along the global bit lines and aligned with a same pitch as the global bit lines; N memory cell arrays each including memory cells each having cylindrical capacitor structure formed at intersections of the word lines and the local bit lines and being arranged corresponding to the sections of the local bit lines; local sense amplifiers for amplifying a signal read out from a selected memory cell to the local bit line and for outputting the signal to the global bit line; and global sense amplifiers for coupling the signal transmitted from the local sense amplifier corresponding to the selected memory cell through the global bit line to an external data line.

19 Claims, 8 Drawing Sheets

SEMICONDUCTOR MEMORY DEVICE

BACKGROUND OF THE INVENTION

1. Field of the Invention

The present invention relates to a semiconductor memory device which rewritably stores data in a plurality or memory cells formed at intersections of a plurality of word lines and a plurality of bit lines, and particularly relates to a semiconductor memory device in which a memory cell array is configured so that an opposite electrode of a capacitor of each memory cell is directly connected to a bit line.

2. Description of the Related Art

Generally, a memory cell array of a DRAM includes a large number of memory cells formed at intersections of bit lines and word lines. Regarding the memory cell composed of one transistor and one capacitor, a structure in which an opposite electrode of the capacitor is directly connected to a bit line is proposed for the purpose of higher integration of the DRAM (e.g., see Patent References 1 to 3). On the premise of such a structure, when achieving a fine memory cell using a design rule such as 4F2 in order to manufacture a large capacity DRAM, it is desirable to employ a memory cell having a cylindrical capacitor structure. The memory cell having such a cylindrical capacitor structure is required to obtain a sufficient capacitance by forming the cylindrical portion with a sufficient height, for example, several μm. The cylindrical capacitor structure can be easily manufactured and occupies a smaller area in a plane so as to be appropriate for increasing the capacity of the DRAM.

Patent Reference 1: Japanese examined patent publication No. S58-32789

Patent Reference 2: Laid-open Japanese Patent Publication No. S60-98597

Patent Reference 3: Laid-open Japanese Patent Publication No. 2002-94027

However, since sides of cylinders of adjacent memory cells are arranged close to each other with a sufficient height when employing the conventional capacitor structure, the capacitance between the cylinders becomes relatively large. Then, the capacitance between the cylinders occupies a larger part of a coupling capacitance between bit lines, which causes an increase in coupling noise between bit lines when reading a signal through a bit line. Particularly, when many memory cells are connected to one bit line in a highly integrated memory cell array, the coupling capacitance between the bit lines accordingly increases, and influence of the coupling noise remarkably increases so that read operation is hindered. In this manner, when employing the cylindrical capacitor structure, it is a problem that operating margin decreases due to the coupling noise caused by the capacitance between the cylinders.

BRIEF SUMMARY OF THE INVENTION

An object of the present invention is to provide a semiconductor memory device in which a hierarchical memory cell array is configured for higher integration of memory cells connected to local bit lines so as to suppress an increase in chip area, and coupling noise caused by coupling capacitance between bit lines is suppressed so as to obtain sufficient operating margin.

An aspect of the present invention is a semiconductor memory device comprising: a plurality of word lines; a plurality of global bit lines intersecting with said plurality of word lines; a plurality of local bit lines partitioned into N (N is an integer greater than or equal to two) sections along said global bit lines and aligned with a same pitch as said plurality of global bit lines; N memory cell arrays each including a plurality of memory cells each having cylindrical capacitor structure formed at intersections of said plurality of word lines and said plurality of local bit lines and being arranged corresponding to the sections of said local bit lines; a plurality of local sense amplifiers for amplifying a signal read out from a selected memory cell to said local bit line and for outputting the signal to said global bit line; and a plurality of global sense amplifiers for coupling the signal transmitted from said local sense amplifier corresponding to the selected memory cell through said global bit line to an external data line.

According to the semiconductor memory device of the present invention, in a hierarchical memory cell array, the local bit lines each partitioned into N sections along the global bit line are arranged, a signal read out from a memory cell formed at an intersection of the word line and the local bit line is amplified by the local sense amplifier through the local bit line, and the signal is further transmitted to the global bit line so as to be coupled to the external data line. Thus, when employing the cylindrical capacitor structure, the coupling capacitance between adjacent local bit lines can be reduced by shortening the length of the local bit lines. Thereby, the coupling noise is reduced so as to secure reading performance for the memory cell, and an increase in chip area can be suppressed in the semiconductor memory by arranging memory cells with high density.

In the present invention each of said memory cells may have an opposite electrode of said cylindrical capacitor structure directly connected to said local bit line.

In the present invention, each of said memory cells may comprise one MOS transistor and one capacitor, said COS transistor may have a gate electrode connected to said word liner one source/drain electrode to which a predetermine fixed potential is applied, and an other source/drain electrode connected to an accumulation electrode of said capacitor having a cylindrical shape, said capacitor may be formed so that said opposite electrode and said accumulation electrode are arranged oppositely to each other via a dielectric film between an inside face and a side face of the cylindrical shape and said opposite electrode is connected to said local bit line on an upper layer, and an insulation film for separating between adjacent said capacitors having the cylindrical shape from each other may be formed on an upper layer of said Local transistor.

In the present invention, said local sense amplifiers may be single-ended sense amplifiers arranged so that a pitch thereof in a word line extending direction is twice the pitch of said local bit lines.

In the present invention, said local sense amplifier may include an amplifying MOS transistor for amplifying the signal read out to said local bit line and for outputting the signal to said global bit line and may include a precharging MOS transistor for recharging said local bit line.

In the present invention, a voltage range within which a threshold voltage of said amplifying MOS transistor distributes may be set higher than a signal of low level read out from a selected memory cell and lower than a signal of high level read out from the selected memory cell when the selected word line is activated.

In the present invention, said amplifying MOS transistor may be an NMOS transistor connected between said global bit line and a ground voltage and having a gate connected to said local bit line, and said precharging MOS transistor may be an NMOS transistor connected between said local bit line and the ground voltage and having a gate connected to a precharge signal line.

In the present invention, said amplifying MOS transistor may be a PMOS transistor connected between a power supply voltage and said global bit line and having a gate connected to said local bit line, and said precharging MOS transistor may be a PMOS transistor connected between the power supply voltage and said local bit line and having a gate connected to a precharge signal line.

In the present invention, a signal obtained by inverting the signal of said local bit line may be transmitted through said global bit line, and said global sense amplifier may include a precharging MOS transistor for precharging said global bit line with an opposite polarity to said local bit line.

In the present invention, said global sense amplifiers may be arranged so that a pitch thereof in a word line extending direction is twice the pitch of said global bit lines and said local bit lines.

As described above, according to the present invention, by employing a hierarchical memory cell array, the entire semiconductor memory device is configured by arranging local bit lines each partitioned into N sections along the global bit line, and the cylindrical capacitor structure is employed in each memory cell to achieve a high-density semiconductor memory device. Thereby, the coupling capacitance between adjacent local bit lines can be reduced by shortening the length of the local bit lines. Accordingly, the influence of the coupling noise can be suppressed so that the quality of a read signal is improved, and excellent operating margin Is achieved. Further, memory cells having a small size as 4F2 can be achieved using the cylindrical capacitor structure and the simple single-ended local sense amplifiers, and thus an increase in the entire chip area can be suppressed.

BRIEF DESCRIPTION OF THE DRAWINGS

The above and other objects and features of the invention wile appear more fully hereinafter from a consideration of the following description taken in connection with the accompanying drawing wherein one example is illustrated by way of example, in which.

DETAILED DESCRIPTION OF THE INVENTION

A preferred embodiment of the present invention will be described with reference to the accompanying drawings. In the following, an embodiment in which the present invention is applied to a DRAM having a hierarchical memory cell array as a semiconductor memory device will be described.

Figure 1:
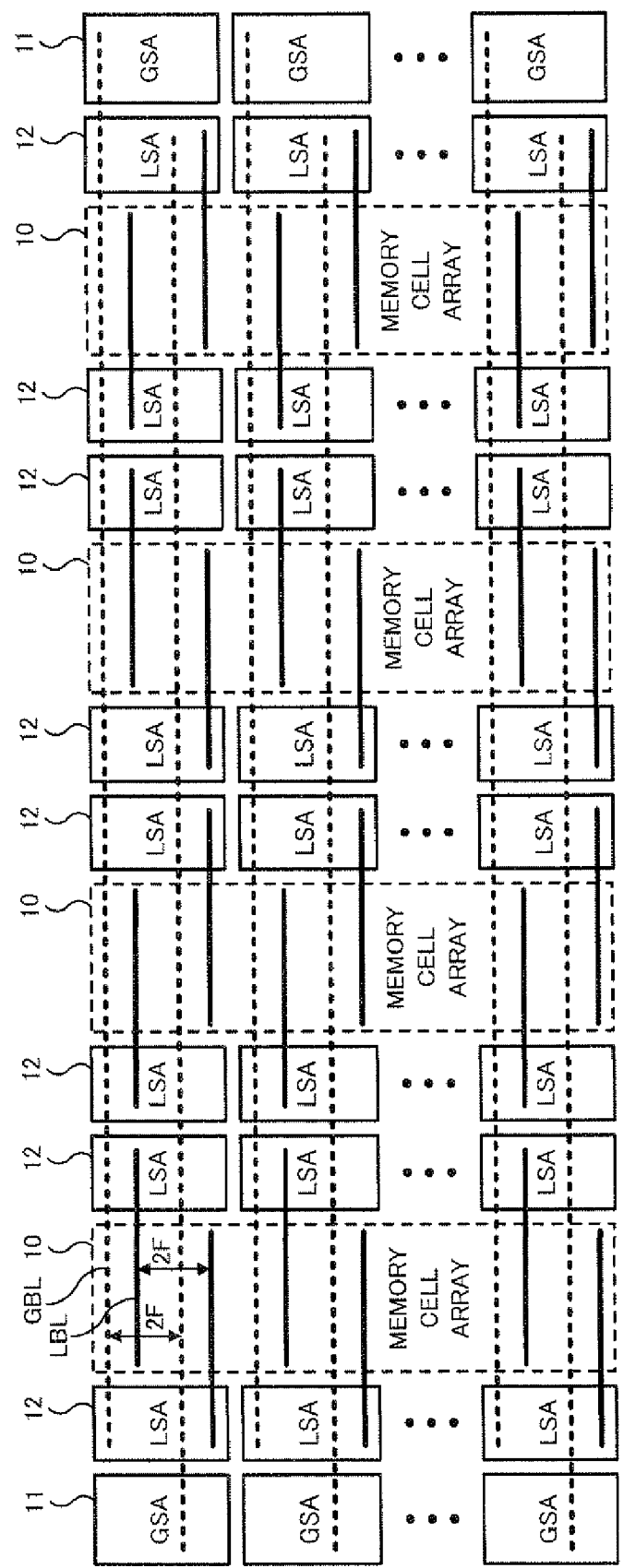
FIG. 1 is an entire configuration of a DRAM of an embodiment.

FIG. 1 shows an entire configuration of the DRAM of the embodiment. In FIG. 1, there are shown four memory cell arrays 10, a plurality of global sense amplifiers 11, a plurality of local sense amplifiers 12, a plurality of global bit lines GBL, and a plurality of local bit lines LBL.

Each memory cell array 10 includes a large number of memory cells formed at all intersections of a plurality of word lines and the plurality of local bit lines LBL intersecting therewith. As shown in FIG. 1, the plurality of local his lines LBL is regularly aligned with a pitch 2F based on a design rule value F in a word line extending direction. Besides, the plurality of global bit lines GBL is also aligned with the same pitch 2F as the local bit lines LBL.

The local sense amplifiers 12 are arranged on both sides of the memory cell arrays 10, and each local sense amplifier 12 amplifies a signal read from a memory cell through a predetermined local bit line LBL. As shown in FIG. 1, one of two local bit lines LBL adjacent in the word line extending direction in the memory cell array 10 is connected to the left-side local sense amplifier 12, while the other thereof is connected to the right-side local sense amplifier 12. In this case, since each local bit line LBL is partitioned into sections corresponding to the arrangement of the memory cell arrays 10, each local sense amplifier 12 depends only on one memory cell array 10. Besides, the plurality of the local sense amplifiers 12 is aligned with a pitch 4F in the word line extending direction.

On the contrary, the global sense amplifiers 11 are arranged at both ends of the four memory cell arrays 10, and each global sense amplifier 12 further amplifies data transmitted from the local sense amplifier 12 to the global bit line GBL. As shown in FIG. 1, each global bit line GBL is arranged extending over all the four memory cell arrays 10. Thus, each global bit line GBL is connected to predetermined our local sense amplifiers 12 among eight local sense amplifiers 12 arranged in a line in a bit line extending direction. Further, one of two global bit lines GBL adjacent in the memory cell array 10 is connected to the left-side global sense amplifier 11, while the other thereof is connected to the right-side global sense amplifier 11. Besides, the plurality of global sense amplifiers 11 is also aligned with the pitch 4F in the word line extending direction.

When m local bit lines LBL are arranged in one memory cell array 10, m/2 local sense amplifiers 12 connected to m/2 local bit lines LBL are arranged on each of both sides of the memory cell array 10. In the entire four memory cell arrays 10, 4m local sense amplifiers 12 in total are arranged in eight rows, and m global sense amplifiers 11 in total are arranged in two rows (at both ends).

In this manner, since the memory cell array 10 is configured hierarchically, an increase in the number of memory cells connected to one local bit line LBL can be suppressed. When four of the above memory cell arrays 10 each including the above n word lines are arranged in parallel, data of 4n memory cells can be transmitted selectively through the global bit line GBL, but n memory cells connected to the local bit line LBL are only required. As the number of memory cells connected to the local bit line LBL is reduced, the parasitic capacitance and resistance of the local bit line LBL are reduced and influence of coupling noise can be suppressed, as described later.

Figure 2:
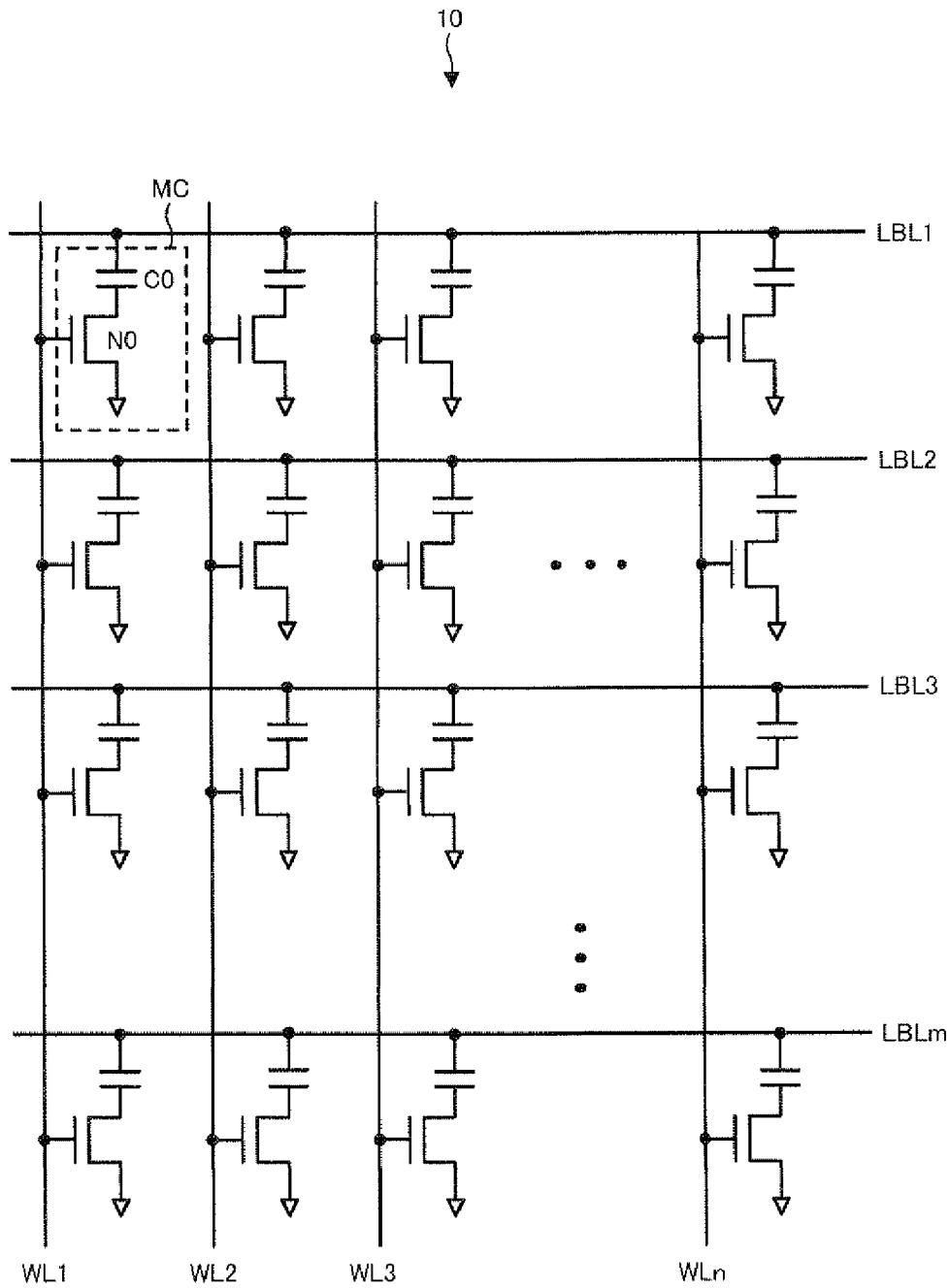
FIG. 2 is a diagram showing a configuration of a memory cell array of FIG. 1.

A configuration of the memory cell array 10 of FIG. 1 will be described with reference to FIG. 2. The memory cell array 10 shown in FIG. 2 Includes a plurality of memory cells MC formed at all intersections of n word lines WL (WL1 to WLn) and m local bit lines LBL, and each memory cell MC is composed of an NMOS transistor N0 and a capacitor C0. Since m×n memory cells MC are arranged in one memory cell array 10, the memory cell array 10 becomes capable of storing m×n bit data in total.

In each memory cell MC, an opposite electrode of the capacitor C0 is directly connected to the local bit line LBL, a fixed potential is applied to one end of the NMOS transistor N0, and the other end of the NMOS transistor N0 is connected to an accumulation electrode of the capacitor C0. The fixed potential applied to the one end of the NMOS transistor N0 is set to, for example, an intermediate voltage between a power supply voltage and a ground potential. Further, a word line WL is connected to a gate electrode of the NMOS transistor N0. When one word line WL selected in the memory cell array 10 is driven, m NMOS transistors N0 on the word line WL turn on and a minute signal based on accumulated charge of the capacitor C0 is read out to each local bit line LBL.

Figure 3A:
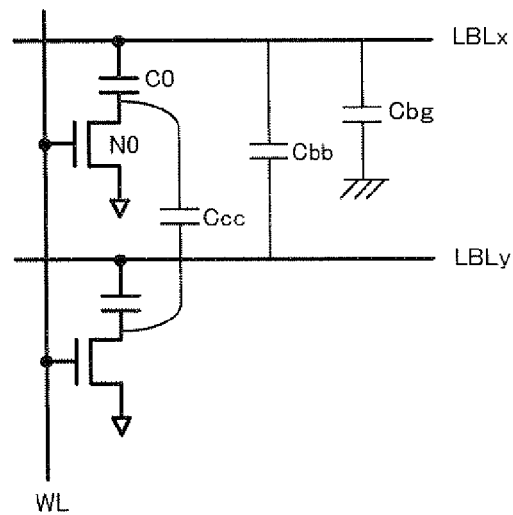
FIGS. 3A and 3B are diagrams explaining a structure of a memory cell MC and a capacitance of a local bit line LBL.
Figure 3B:
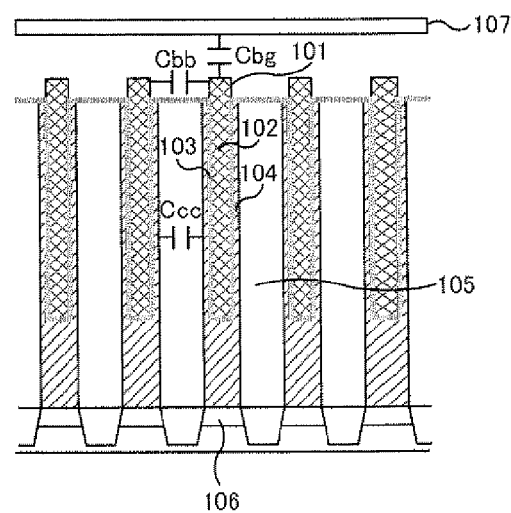

In this embodiment, cylindrical capacitors C0 are assumed to be employed in order to easily achieve high-density memory cells MC. Therefore, a reduction in coupling noise caused by coupling capacitance between cylinders becomes a characteristic problem to be solved. In the following, a structure of the memory cell MC and a capacitance of the local bit line LBL in the embodiment will be described with reference to FIGS. 3A and 3B. FIG. 3A shows one memory cell MC on a target local bit line LBLx and the other memory cell MC on an adjacent local bit line LBLy, respectively, in the memory cell array 10. FIG. 3B shows a sectional structure of a predetermined area including the two adjacent memory cells on the target local bit line LBLx and the adjacent local bit line LBLy.

In FIG. 3A, a capacitance between cylinders Ccc, a capacitance between adjacent bit lines Cbb, a capacitance to wiring layer Cbg are shown, respectively as capacitances formed at one memory cell MC on the target local bit line LBLx. As shown in the sectional structure of FIG. 3B, a wiring 101 of the target local bit line LBLx is arranged in a vertical direction to a plane of FIG. 3B, and the lower portion of the wiring 101 is connected to an opposite electrode 102 of the capacitor C0. An accumulation electrode 104 of the capacitor C0 is oppositely arranged around the opposite electrode 102 via a dielectric film 103. An insulation film 105 is filled in regions between cylinders of adjacent memory cells MC, and the respective regions are separated from one another. In this manner, a cell capacitance Cs is formed by oppositely arranging the opposite electrode 102 inside the cylinder and the accumulation electrode 104 on the side of the cylinder. The lower end of the accumulation electrode 104 is connected to a diffusion layer 106, thereby the NMOS transistor N0 is formed. Further, a wiring 107 is arranged in a horizontal direction to the plane of FIG. 3B on an upper layer of the local bit lines LBLx and LBLy. This wiring layer 107 is used for forming lines of the power supply voltage, the ground signals, and the like.

The capacitance between cylinders Ccc is formed between sides of the cylinders of two adjacent memory cells MC. Since the sides of the cylinders with a sufficient height are opposed to each other with a short distance, the capacitance between cylinders Ccc has a relatively large capacitance value. The capacitance between adjacent bit lines Cbb is formed between the wirings 101 of the target local bit line LBLx and the adjacent local bit line LBLy, and has a smaller capacitance value relative to the capacitance between cylinders Ccc. The capacitance to wiring layer Cbg is formed between the wiring 101 of the target local bit line LBLx and the wiring layer 107, and has a smaller capacitance value relative to the capacitance between cylinders Ccc. Accordingly, in the structure of FIG. 3B, the capacitance between cylinders Ccc is dominant among capacitances corresponding to one memory cell MC on the target local bit line LBLx.

It is desirable to form the dielectric film 103 using material having a sufficiently large dielectric constant in order to obtain the desired cell capacitance Cs of the capacitor C0. Further, the cell capacitance Cs can be large by forming the cylindrical portion of the capacitor C0 with a sufficient height. Meanwhile, it is desirable to form the insulation film 105 using material having a small dielectric constant in order to suppress the capacitance between cylinders Ccc.

Hereinafter, a local bit line capacitance on the basis of the structure of FIGS. 3A and 3b will be calculated in the memory cell array 10 of FIG. 2. The cell capacitance Cs (a capacitance of the capacitor C0) of one memory cell MC and the capacitance between cylinders Ccc are assumed to have a relation of $Ccc=Cs/200$. Further, the local bit line capacitance of one local bit line LBL as a whole is represented as Cb. As shown in FIG. 3A, since the cell capacitance Cs of the target local bit line LBLx, the capacitance between cylinders Ccc, the cell capacitance Cs of the adjacent local bit line LBLy are connected in series, a series capacitance thereof can be calculated by a following equation.

$$1/(1/Cs+1/Ccc+1/Cs)=0.99Ccc \approx Ccc$$

That is, a composite capacitance per memory cell MC is represented as follows, in consideration that the adjacent local bit lines LBLy exist on both sides of the target local bit line LBLx.

$$2Ccc+2Cbb+Cbg$$

Meanwhile, since n memory cells MC are connected to one local bit line LBL, the local bit line capacitance C0 can be calculated by a following equation.

$$Cb=n(2Ccc+2Cbb+Cbg)$$

Herein, the capacitance between adjacent bit lines Cbb and the capacitance to wiring layer Cbg are assumed to have following relations to the capacitance between cylinders Ccc, on the basis of the structure of FIGS. 3A and 3b.

$$Cbb=Ccc/20=Cs/4000$$

$$Cbg=Ccc/100=Cs/20000$$

By using these relations, the local bit line capacitance Cb can be calculated by a following equation.

$$Cb=nCs(200+10+1)/20000 \approx nCs/100$$

In this manner, the contribution of the capacitance between adjacent bit lines Cbb and the capacitance to wiring Cbg are small in the local bit line capacitance Cb, and the capacitance between cylinders Ccc is dominant in the contribution. Further, as the number n of memory cells MC connected to the local bit line LBL increases, the local bit line capacitance Cb increases. Therefore, it is desirable to limit the number n of the memory cells MC connected to the local bit line LBL by dividing the memory cell array 10 into as small areas as possible. When the hierarchical memory cell array 10 of this embodiment Is employed, the number of the memory cells MC connected to the local bit line LBL can be easily decreased.

Figure 4:
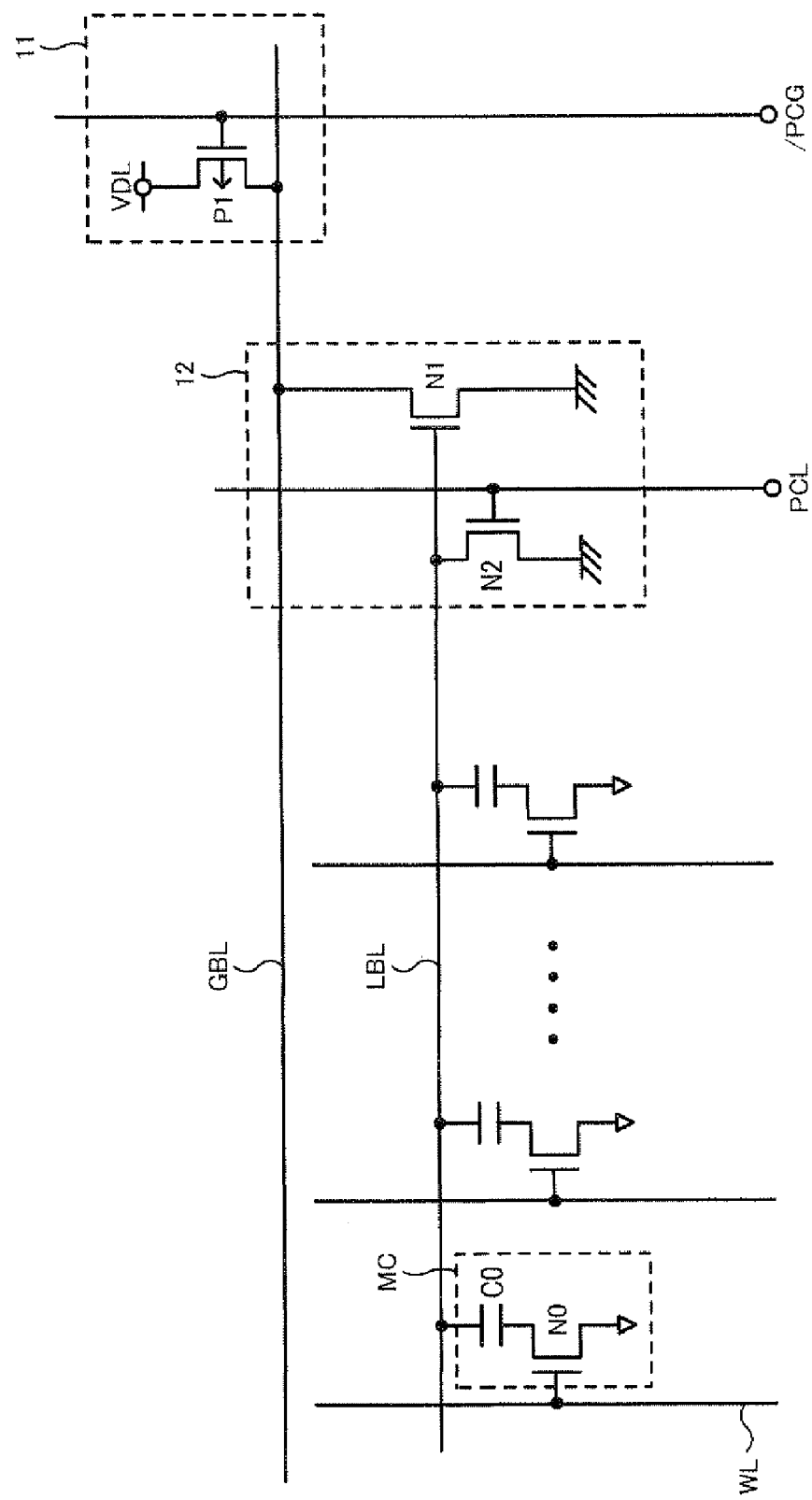
FIG. 4 is a diagram showing a configuration required in read operation in an area including a global bit line GBL, a local bit line LBL, a global sense amplifier 11 and a local sense amplifier 12, regarding a first specific example of the DRAM of the embodiment.

Next, a first specific example of read operation in the DRAM of the embodiment will be described with reference to FIGS. 4 and 5. FIG. 4 shows a configuration required in the read operation in the configuration of FIG. 1, corresponding to an area including one global bit line GBL, one local bit line LBL, one single-ended global sense amplifier 11 and one single-ended local sense amplifier 12.

The local sense amplifier 12 includes an amplifying NMOS transistor N1 and a precharging NMOS transistor N2. The amplifying NMOS transistor N1 is connected between the global bit line GBL and ground, and the gate thereof is connected to one end of the local bit line LBL. The plurality of memory cells MC each composed of the NMOS transistor N0 and the capacitor C0 is connected to the local bit line LBL, like in FIG. 2. The precharging NMOS transistor N2 is connected between the local bit line BL and ground, and the gate thereof is connected to a precharge signal line PCL. Note that the local sense amplifier 12 actually includes a write circuit (not shown) required for write operation.

Meanwhile, the global sense amplifier 11 includes a precharging PMOS transistor P1. The precharging SMOS transistor P1 is connected between a power supply voltage VDL and the global bit line GBL, and the gate thereof is connected to a precharge signal line /PCGA. The symbol / attached to each signal name means negative logic. Note that the global sense amplifier 11 actually includes an input/output circuit (not shown) connected to input/output lines.

In a precharge operation, the precharge signal line PCL of the local sense amplifier 12 is controlled to be high, and the precharge signal line /PCG of the global sense amplifier 11 is controlled to be low. Thus, the local bit line LBL is precharged to a ground potential VSS, and the global bit line GBL is precharged to the power supply voltage VDL. On the other hand, in the read operation for the memory cell MC, the precharge signal line PCL is controlled to be low and the precharge signal line /PCG is controlled to be high.

In this state, when the selected word line WL is driven, a signal read from an arbitrary memory cell MC is input to the gate of the amplifying NMOS transistor N1 through the local bit line LBL. When a high level is read out to the local bit line LBL, the global bit line GBL goes low, while when a low level is read out to the local bit line LBL, the global bit line GBL goes high, respectively by the operation of the amplifying NMOS transistor N1.

Figure 5:
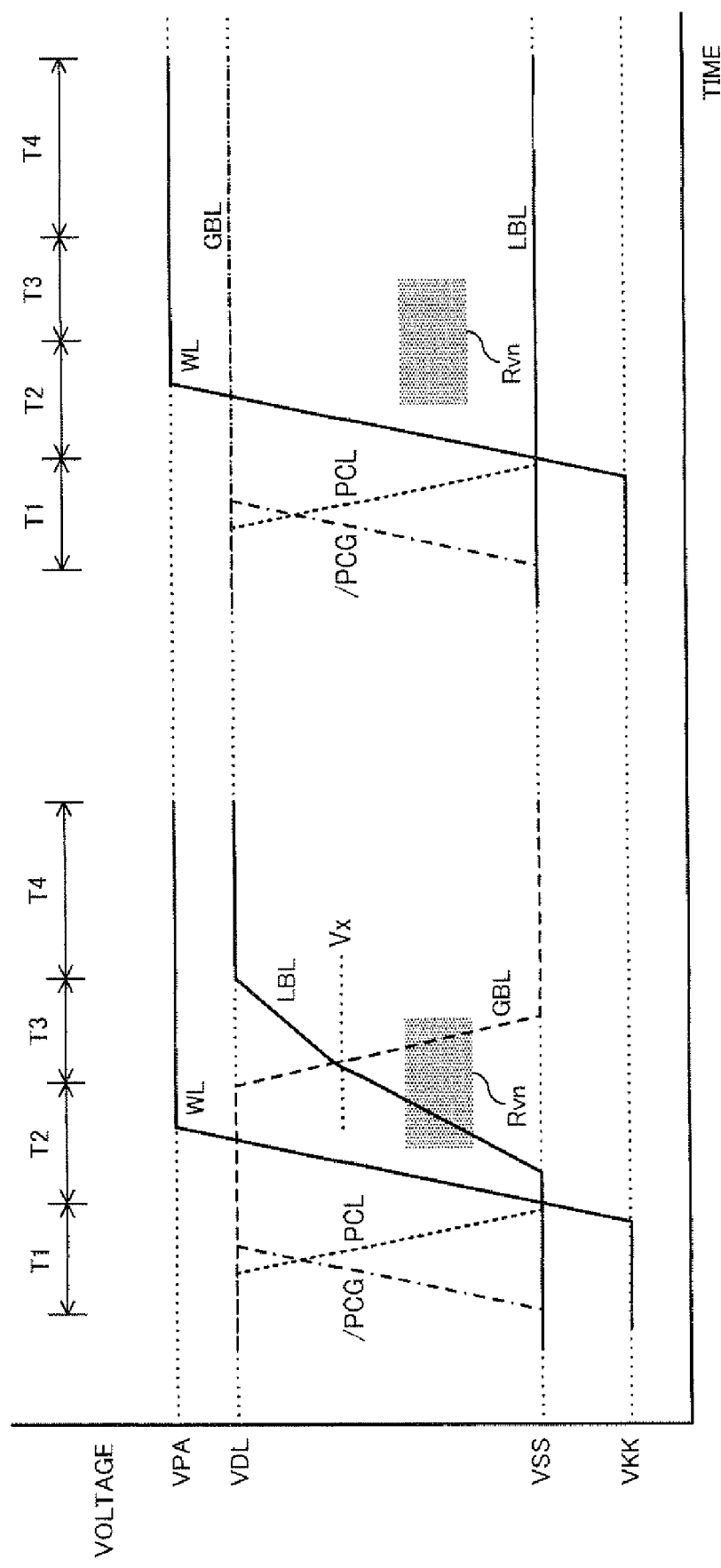
FIG. 5 is a diagram showing waveforms in a read operation where a high level is read first and subsequently a low level is read out in the circuit configuration of FIG. 4.

FIG. 5 shows waveforms in a read operation where a high level is read out from a selected memory cell MC first and subsequently a low level is read out from the selected memory cell MC in the configuration of FIG. 4. Four terms (T1 to T4) into which one read operation is divided are shown in the upper side of FIG. 5. Before a precharge cancel period T1 in the first half of FIG. 5, the precharge signal line PCL is controlled to be high and the precharge signal line /PCG is controlled to be low. Thus, the local bit line LBL is precharged to low and the global bit line GBL is precharged to high. Then, during the precharge cancel period T1, the precharge signal line PCL changes from high to low in order to cancel the precharge state of the local bit line LBL, and the precharge signal line /PCG changes from low to high in order to cancel the precharge state of the global bit line GBL.

During a cell selecting period T2, the word line WL selected corresponding to the target memory cell MC rises from a negative voltage VKK to a positive voltage VPA. The negative voltage VKK is set to a value lower than "low level" (ground potential VSS), and the positive voltage VPA is set to a value higher than "high level" (power supply voltage VDL). As a result, a signal of high level stored in a memory cell MC at an intersection of the word line WL and the local bit line LBL is read out and input to the local sense amplifier 12, thereby increasing the local bit line LBL to a voltage Vx. At this point, the voltage Vx of the local bit line LBL is set to a value higher than at least a threshold voltage range Rvn (represented by hatching In FIG. 5) of the amplifying NMOS transistor N1. The threshold voltage range Rvn is distributed within a predetermined voltage range depending on temperature or process fluctuation.

Subsequently, during a sensing period T3, the level of the global bit line GBL falls from high to low via the amplifying NMOS transistor N1 which has turned on. Meanwhile, the low level of the global bit line GBL is inverted by the write circuit (not shown) of the local sense amplifier 12 so as to increase the potential of the local bit line LBL, which gradually changes from the above voltage Vx to the level of the power supply voltage VDL. During a read period T4, in a state where the local bit line LBL remains high and the global bit line GBL remains low, the low level is read out to the input/output lines through the input/output circuit (not shown) of the global sense amplifier 11. Thereby, one read operation of the DRAM is completed.

Next, in the second half of FIG. 5, waveforms in the same manner in the read operation where data of low level stored in the memory cell MC is read out. The waveforms during the precharge cancel period T1 is the same as in the first half of FIG. 5. Meanwhile, after the selected word line WL rises from the negative voltage VKK to the positive voltage VPA during the cell selecting period T2, the signal of low level stored in the memory cell MC is read out, and thus the local bit line LBL continues to remain low. During the sensing period T3, the global bit line CDL remains high by inverting the low level of the local bit line LBL. Thus, in a state where the local bit line LBL remains low and the global bit line GBL remains high during the read period T4, the high level is read out to the input/output lines in the manner described above.

Figure 6:
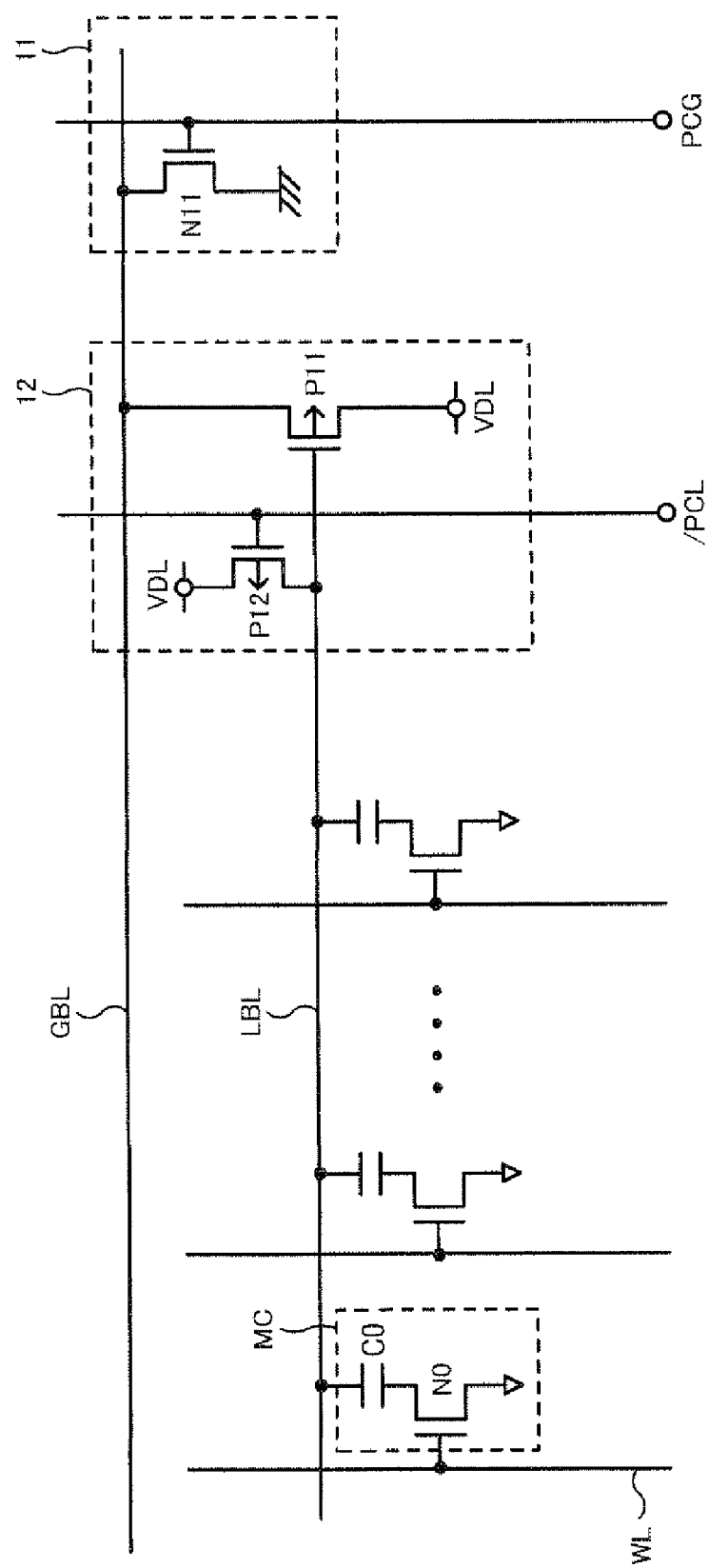
FIG. 6 is a diagram showing a configuration required in read operation in an area including a global bit line GBL, a local bit line LBL, a global sense amplifier 11 and a local sense amplifier 12, regarding a second specific example of the DRAM of the embodiment.

Next, a second specific example of read operation in the DRAM of the embodiment will be described with reference to FIGS. 6 and 7. FIG. 6 shows an example in which the configuration of the local sense amplifier 12 and the global sense amplifier 11 is modified in the same area as shown in FIG. 4. Besides, one local bit line LBL, the plurality of memory cells MC connected thereto, and one global bit line CBL are arranged in the same manner as FIG. 4.

The local sense amplifier 12 includes an amplifying PMOS transistor P11 and a precharging PMOS transistor P12. The amplifying PMOS transistor P11 is connected between the power supply voltage VDL and the global bit line GBL, and the gate thereof is connected to one end of the local bit line LBL. The precharging PMOS transistor P12 is connected between the power supply voltage VDL and the local hit line LBL, and the gate thereof is connected to a precharge signal line /PCL. In this manner, the local sense amplifier 12 of FIG. 6 is configured by replacing the two NMOS transistors N1 and N2 of the local sense amplifier 12 of FIG. 4 with the two PMOS transistors P11 and P12.

Meanwhile, the global sense amplifier 11 includes a precharging NMOS transistor N11. The precharging NMOS transistor N11 is connected between the global bit line GBL and ground, and the gate thereof is connected to a precharge signal line PCG. In this manner, the global sense amplifier 11 of FIG. 6 is configured by replacing the precharging PMOS transistor P1 of FIG. 4 with the precharging NMOS transistor N11.

In the precharge operation, the precharge signal line /PCL of the local sense amplifier 12 is controlled to be low, and the precharge signal line PCG of the global sense amplifier 11 is controlled to be high. Thus, the local bit line LBL is precharged to the power supply voltage VDL, and the global bit line GBL is precharged to the ground potential VSS. On the other hand, in the read operation for the memory cell MC, the precharge signal line /PCL is controlled to be high and the precharge signal line PCG is controlled to be low.

In this state, when the selected word line WL is driven, a signal read from an arbitrary memory cell MC is input to the gate of the amplifying PMOS transistor P11 through the local bit line LBL. When a high level is read out to the local bit line LBL, the global bit line GBL goes low, while when a low level is read out to the local bit line LBL, the global bit line GBL goes high, respectively by the operation of the amplifying PMOS transistor P11.

Figure 7:
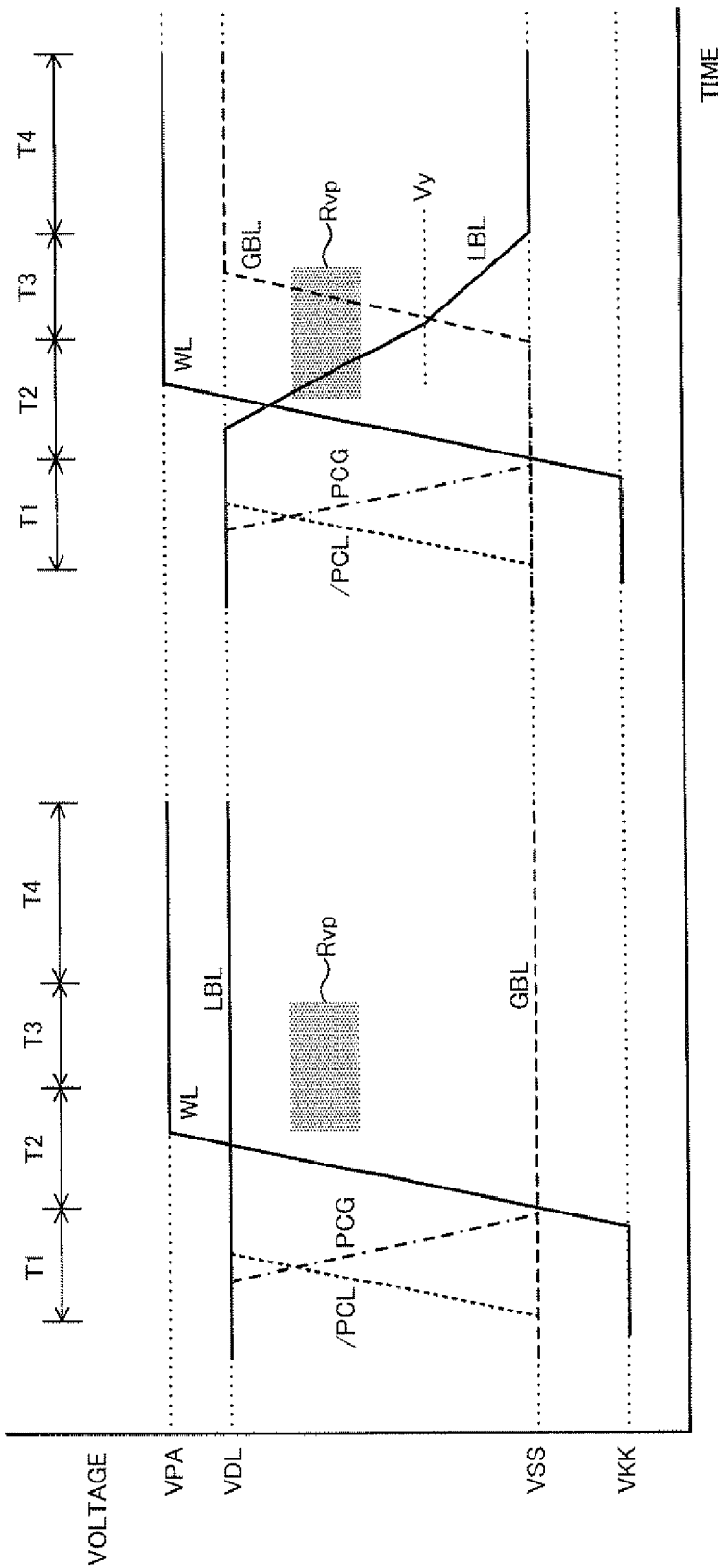
FIG. 7 is a diagram showing waveforms in a read operation where a high level is read first and subsequently a low level is read out in the circuit configuration of FIG. 6.

FIG. 7 shows waveforms in a read operation where a high level is read out from a selected memory cell MC first and subsequently a low level is read out from the selected memory cell MC in the configuration of FIG. 6. The four terms (T1 to T4) shown in the upper side of FIG. 7 have the same meanings as FIG. 5. Most of the waveforms are common to those in FIG. 5, and thus only different points will be mainly described below. Before the precharge cancel period T1 in the first half of FIG. 7, the precharge signal line /PCL is controlled to be low and the precharge signal line PCS is controlled to be high. Thus, the local bit line LBL is precharged to high and the global bit line GBL is precharged to low. In this manner, polarities in FIG. 7 are opposite to those in FIG. 5. Therefore, when canceling the respective precharge states during the precharge cancel period T1, the precharge signal line /PCL changes from low to high and the precharge signal line PCS changes from high to low.

During the cell selecting period T2, the word line WL changes in the same manner as in FIG. 5. As a result, a signal of high level stored in the memory cell MC is read out, and thus the local bit line LBL continues to remain high. Note that a threshold voltage range Rvp (represented by hatching in FIG. 7) of the amplifying PMOS transistor P11 is distributed within a voltage range higher than that of the threshold voltage range Rvn of FIG. 5. Meanwhile, the global bit line GEL remains low by inverting the high level of the local bit line LBL during the sensing period T3. Thus, in a state where the local bit line LBT remains high and the global bit line GBL remains low during the read period T4, the low level is read out to the input/output lines via the above input/output circuit (not shown).

Next, in the second half of FIG. 7, waveforms in the same manner in the read operation where data of low level in the memory cell MC is read out. The waveforms during the precharge cancel period T1 is the same as in the first half of FIG. 7. Meanwhile, after the selected word line WL rises from the negative voltage VKK to the positive voltage VPA during the cell selecting period T2, the signal of low level stored in the memory cell MC is read out and input to the local sense amplifier 12, thereby decreasing the local bit line LBL to a voltage Vy from the power supply voltage VDL. At this point, the voltage vy of the local bit line LBL is set to a value lower than at least the above threshold voltage range Rvp of the amplifying PMOS transistor P11.

Subsequently, the global bit line GBL rises from low to high via the amplifying PMOS transistor P11 which has turned on during the sensing period T3. Meanwhile, the high level of the global bit line GBL is inverted by the write circuit (not shown) of the local sense amplifier 12 so as to decrease the potential of the local bit line LBL, which gradually changes from the above voltage Vy to the ground potential VSS. During the read period T4, in a state where the local bit line LBL remains low and the global bit line GBL remains high, the high level is read out to the input/output lines via the above input/output circuit (not shown).

Figure 8:
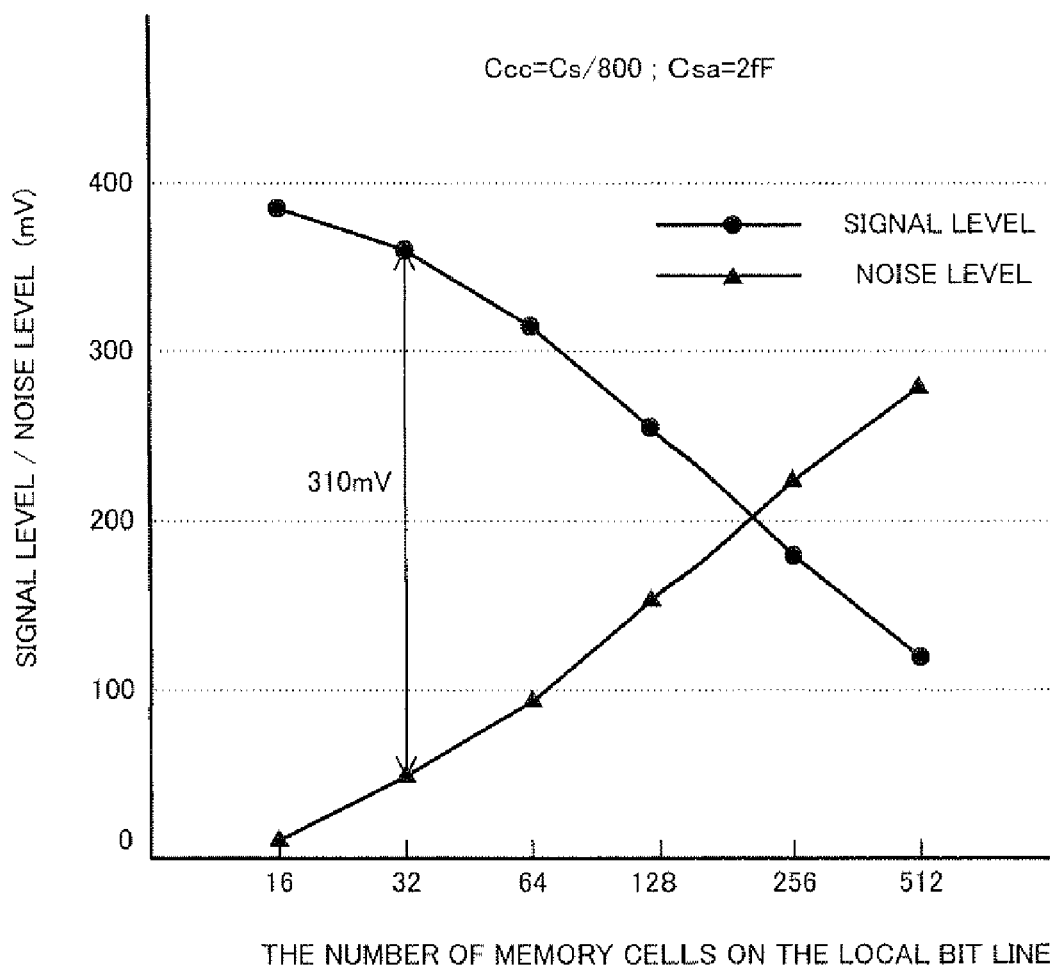
FIG. 8 is a diagram explaining a specific effect in a case where the configuration of the embodiment is employed.

As describe above, by employing the configuration of the embodiment, it is possible to reduce the coupling noise between the local bit lines LBL caused by the cylindrical capacitor structure of the memory cells MC. Hereinafter, a specific effect in a case where the configuration of the embodiment is employed will be described with reference to FIG. 8. In FIG. 8, the number of memory cells MC connected to the local bit line LBL is indicated on a horizontal axis (represented by logarithm). Meanwhile, analysis results of simulations are indicated on a vertical axis, which includes a signal level read out to the local sense amplifier 12 through the local bit line LBL and includes a noise level, and both levels are represented by graphs. Here, the capacitance between cylinders Ccc is set to Cs/800 relative to the cecl capacitance Cs, which can be achieved based on material selection for the capacitor C0 and the shape of the cylinder, and a capacitance Csa of the local sense amplifier 12 is assumed to be 2fF.

If the length of the local bit lines LBL becomes longer, that is, the number of memory cells MC connected thereto is increased, the coupling capacitance between the local bit lines LBL increases. Therefore, the signal level decreases while the noise level increases. The noise level exceeds the signal level within a range of the number of memory cells MC between 128 and 256. Since the difference between the signal level and the noise level is 310 mV under a condition where the number of memory cells MC is 32 in FIG. 8, the signal of the memory cell MC can be read without being hindered.

In order to reduce the number of memory cells MC on the local bit line LBL in this manner, the hierarchical memory cell array 10 may be divided into small areas. The configuration in which the four memory cell arrays 10 are included in the entire DRAM has been described in the embodiment, however the entire DRAM can be configured to include N (an arbitrary number) memory cell arrays 10 so as to arrange the local bit lines LBL partitioned into N sections along one global bit line GBL. In this case, as the larger number N is set, the number of memory cells MC connected to one local bit line LBL can be reduced. Accordingly, in a case where a large capacity DRAM is achieved by employing the cylindrical capacitor structure, the influence of the coupling noise between the local bit lines LBL can be suppressed so that excellent performance can be obtained.

The present invention is not limited to the above described embodiments, and various variations and modifications may be possible without departing from the scope of the present invention.

This application is based on the Japanese Patent application No. 2007-123996 filed on May 8, 2007, entire content of which is expressly incorporated by reference herein.

What is claimed is:

1. A semiconductor memory device comprising:
   a plurality of word lines;
   a plurality of global bit lines intersecting with said plurality of word lines;
   a plurality of local bit lines partitioned into N (N is an integer greater than or equal to two) sections along said global bit lines and aligned with a same pitch as said plurality of global bit lines;
   N memory cell arrays each including a plurality of memory cells each having cylindrical capacitor structure formed at intersections of said plurality of word lines and said plurality of local bit lines and being arranged corresponding to the sections of said local bit lines;
   a plurality of local sense amplifiers for amplifying a signal read out from a selected memory cell to said local bit line and for outputting the signal to said global bit line; and
   a plurality of global sense amplifiers for coupling the signal transmitted from said local sense amplifier corresponding to the selected memory cell through said global bit line to an external data line.

2. The semiconductor memory device according to claim 1, wherein each of said memory cells has an opposite electrode of said cylindrical capacitor structure directly connected to said local bit line.

3. The semiconductor memory device according to claim 2, wherein each of said memory cells comprises one MOS transistor and one capacitor,
said MOS transistor has a gate electrode connected to said word line, one source/drain electrode to which a predetermine fixed potential is applied, and an other source/drain electrode connected to an accumulation electrode of said capacitor having a cylindrical shape,
said capacitor is formed so that said opposite electrode and said accumulation electrode are arranged oppositely to each other via a dielectric film between an inside face and a side face of the cylindrical shape and said opposite electrode is connected to said local bit line on an upper layer,
and an insulation film for separating between adjacent said capacitors having the cylindrical shape from each other is formed on an upper layer of said MOS transistor.

4. The semiconductor memory device according to claim 1, wherein said local sense amplifiers are single-ended sense amplifiers arranged so that a pitch thereof in a word line extending direction is twice the pitch of said local bit lines.

5. The semiconductor memory device according to claim 4, wherein said local sense amplifier includes an amplifying MOS transistor for amplifying the signal read out to said local bit line and for outputting the signal to said global bit line and includes a precharging MOS transistor for precharging said local bit line.

6. The semiconductor memory device according to claim 5, wherein a voltage range within which a threshold voltage of said amplifying MOS transistor distributes is set higher than a signal of low level read out from a selected memory cell and lower than a signal of high level read out from the selected memory cell when the selected word line is activated.

7. The semiconductor memory device according to claim 5, wherein said amplifying MOS transistor is an NMOS transistor connected between said global bit line and a ground voltage and having a gate connected to said local bit line,
and said precharging MOS transistor is an NMOS transistor connected between said local bit line and the ground voltage and having a gate connected to a precharge signal line.

8. The semiconductor memory device according to claim 5, wherein said amplifying MOS transistor is a PMOS transistor connected between a power supply voltage and said global bit line and having a gate connected to said local bit line,
and said precharging MOS transistor is a PMOS transistor connected between the power supply voltage and said local bit line and having a gate connected to a precharge signal line.

9. The semiconductor memory device according to claim 1, wherein a signal obtained by inverting the signal of said local bit line is transmitted through said global bit line,
and said global sense amplifier includes a precharging MOS transistor for precharging said global bit line with an opposite polarity to said local bit line.

10. The semiconductor memory device according to claim 9, wherein said global sense amplifiers are arranged so that a pitch thereof in a word line extending direction is twice the pitch of said global bit lines and said local bit lines.

11. The semiconductor memory device according to claim 1, wherein a capacitance between said local bit lines adjacent to each other is smaller than a capacitance between cylinders of said capacitors adjacent to each other.

12. A device comprising:
a plurality of global bit lines each elongated in a first direction, the global bit lines being arranged in a first pitch in a second direction crossing the first direction;
a plurality of global sense amplifiers provided respectively for the global bit lines; and
a plurality of memory cell arrays arranged in the first direction, each of the memory cell arrays including a plurality of word lines each elongated in the second direction, a plurality of local bit lines each elongated in the first direction to intersect the word lines, a plurality of local sense amplifiers provided respectively for the local bit lines, and a plurality of memory cells each disposed at an associated one of intersections of the word lines and the local bit lines, the local bit lines being arranged in a second pitch in the second direction;
the second pitch being substantially equal to the first pitch, and each of the global bit lines being connected in common to associated ones of the local sense amplifiers of respective ones of the memory cell arrays.

13. The device as claimed in claim 1, wherein each of the local sense amplifiers includes a transistor coupled between an associated one of the global bit lines and a reference potential line and having a control electrode connected to an associated one of the local bit lines.

14. The device as claimed in claim 13, wherein each of the local sense amplifiers further includes a precharge circuit between an associated one the local bit lines and a precharge potential line to precharge the associated one of the local bit lines a precharge level at the precharge potential line.

15. A device comprising:
first and second global sense amplifiers arranged to sandwich first and second local sense amplifier areas and first memory cell area therebetween, the first local sense amplifier area being between the first global sense amplifier and the first memory cell area, the second local sense amplifier area being between the first memory cell area and second global sense amplifier;
a first global bit line elongated from the first global sense amplifier toward the second global sense amplifier;
a second global bit line elongated from the second global sense amplifier toward the first global sense amplifier;
a first memory cell array formed in the first memory cell area, the first memory cell array including first and second local bit lines, a plurality of first word lines intersecting the first and second local bit lines, and a plurality of first memory cells each disposed at an associated one of intersections of the first and second local bit lines and the first word lines;
a first local sense amplifier formed in the first local sense amplifier area and coupled between the first global bit line and the first local bit line; and
a second local sense amplifier formed in the second local sense amplifier area and coupled between the second global bit line and the second local bit line.

16. The device as claimed in claim 15, wherein the first and second global sense amplifiers further sandwiches a third local sense amplifier area and a second memory cell area, the second memory cell area being sandwiched between the second and third local sense amplifier areas, the device further comprising:
a second memory cell array formed in the second memory cell area, the second memory cell array including third and fourth local bit lines, a plurality of second word lines intersecting the third and fourth local bit lines, and a plurality of second memory cells each disposed at an associated one of intersections of the third and fourth local bit lines and the second word lines;

a third local sense amplifier formed in the second local sense amplifier area and coupled between the first global bit line and the third local bit line; and a fourth local sense amplifier formed in the third local sense amplifier area and coupled between the second global bit line and the fourth local bit line.

17. The device as claimed in claim 15, wherein a distance between the first and second main bit lines being substantially equal to a distance between the first and second local bit lines and to a distance between the third and fourth local bit lines.

18. The device as claimed in claim 15, wherein a third memory cell area is inserted between the third local sense amplifier area and the second global sense amplifier, and the device further comprises:

a third memory cell array formed in the third memory cell area, the third memory cell array including a fifth local bit line, a plurality of third word lines intersecting the fifth local bit line, and a plurality of third memory cells each disposed at an associated one of intersections of the fifth local bit line and the third word lines; and a fifth local sense amplifier formed in the third local sense amplifier area and coupled between the first global bit line and the fifth local bit line.

19. The device as claimed in claim 18, a fourth local sense amplifier area is inserted between the third memory cell area and the second global sense amplifier, and the third memory cell array further includes a sixth local bit line and a plurality of additional third memory cells each disposed at an associated one of intersections of the sixth local bit line and the third word lines, the device further comprising a sixth local sense amplifier formed in the fourth local sense amplifier area and coupled between the second global bit line and the sixth local bit line.

* * * * *